United States Patent [19]

Natsume

[11] Patent Number: 5,644,368
[45] Date of Patent: Jul. 1, 1997

[54] COMPOSITE SIGNAL DETECTING APPARATUS HAVING ASSOCIATED FILTER

[75] Inventor: Yoshitaka Natsume, Kanagawa, Japan

[73] Assignee: Sony Corporation

[21] Appl. No.: 556,149

[22] Filed: Nov. 9, 1995

[30] Foreign Application Priority Data

Nov. 30, 1994 [JP] Japan .................................. 6-321238

[51] Int. Cl.⁶ .................................................. H04N 5/445
[52] U.S. Cl. ......................... 348/737; 348/736; 348/732; 455/307
[58] Field of Search ....................... 348/727, 728, 348/731, 738, 737, 736, 732, 725; 455/306, 307; H04N 5/455

[56] References Cited

U.S. PATENT DOCUMENTS

| 4,107,730 | 8/1978 | Jones ........................................ 348/736 |
| 4,811,096 | 3/1989 | Gakumura ................................. 348/736 |

FOREIGN PATENT DOCUMENTS

| 0445579A2 | 9/1991 | European Pat. Off. ......... H04N 5/62 |
| 2016155 | 10/1971 | Germany ........................... H04N 5/62 |
| 59-090471 | 5/1984 | Japan ................................ H04N 5/48 |
| 179672 | 7/1988 | Japan ............................... H04N 5/455 |
| 0087271 | 11/1988 | Japan ............................... H04N 5/455 |

OTHER PUBLICATIONS

European Search Report, Re: EP 95 40 2698, dated May 17, 1996.

Fernseh Und Kinotechnik, "Neue verlustleistungsarme integrierte Schaltungen fur die ZF–Signalverarbeitung", vol. 42, No. 5, pp. 221–226, May 30, 1988.

Primary Examiner—Glenton B. Burgess
Attorney, Agent, or Firm—Ronald P. Kananen

[57] ABSTRACT

A detecting circuit for a composite signal containing a video signal and an audio signal. A filter for attenuating the video and audio signals is provided in a PLL circuit loop disposed in the detecting circuit, thus the video or audio signal component generated in the output of the PLL circuit can be reduced and a beat component is not generated in the output of the detecting circuit.

40 Claims, 1 Drawing Sheet

COMPOSITE SIGNAL DETECTING APPARATUS HAVING ASSOCIATED FILTER

BACKGROUND OF THE INVENTION

1. Field of the Invention

The present invention relates to a signal detecting apparatus, and is applicable to an intermediate frequency detecting circuit for detecting, for example, a video intermediate frequency signal containing a video and an audio used in a color television receiver and so on.

2. Description of the Relative Art

A conventional color television receiver receives a vestigial side-band (VSB) broadcasting signal by a tuner and demodulates a video intermediate frequency signal (VIF signal) containing a sound carrier ($f_A$) and a chrominance subcarrier ($f_{SC}$). Thus, beats of, for example, 920 [KHz] is generated in proportional to the magnitude of the sound carrier and the chrominance subcarrier. When the beats change the envelope of carrier chrominance signal, non-linear distortion is generated in a luminance signal and a chrominance signal, which appears as stripes due to beat interference on the screen.

To reduce the beat interference, it is sufficient to make the sound carrier small in contrast to the picture carrier in the VIF signal, and then the signal is input in the video intermediate frequency detecting circuit for detection. Therefore, the color television receiver supplies the VIF signal to a surface acoustic wave filter (hereinafter referred to as a SAW filter) for waveform shaping so that the sound carrier and the chrominance subcarrier are significantly attenuated as compared with that in the monochrome television.

In NTSC system and PAL system, upper and lower side bands of the carrier chrominance signal need to be symmetry when demodulating the chrominance signal to eliminate crosstalk between two chrominance signals which are obtained by quadrature two-phase modulation of the chrominance subcarrier. Thus, the SAW filter having characteristics in which the amplitude of chrominance subcarrier frequency is at –3 [dB] to –6 [dB] from the level is selected, so that the setting range for setting the magnitude of sound carrier and chrominance subcarrier is limited.

Recently, the television is increased in its size so that high picture quality is required even for ground wave broadcasting. Particularly in the tuner systems, the video characteristics depend on the video intermediate frequency detecting circuit. There is a video intermediate frequency detecting circuit with an inter-carrier system simply arranged by using a PLL circuit.

This type of video intermediate frequency detecting circuit provides a VIF signal, for example, to two multipliers and the PLL circuit respectively, and provides the output from the PLL circuit to two multipliers to detect an image. This results in an ability to obtain the video signal from one of the multipliers and an audio signal by demodulating a signal of difference frequency between above signal and the signal taken out from the other adder.

However, since the margin of setting range is narrow when the attenuation level of the sound carrier and the chrominance subcarrier is set in the SAW filter as described above, the sound carrier and the chrominance subcarrier remain in the VIF signal which has passed through the SAW filter. In addition, since it is necessary to extract the sound signal while assuring sufficient S/N ratio, the sound carrier is never sufficiently attenuated. Thus, a voltage control oscillator (hereinafter referred to as a "VCO") which constitutes the PLL circuit in the aforementioned video intermediate frequency detecting circuit operates based on the VIF signal in which the sound carrier and the chrominance subcarrier remain, and outputs a switching carrier containing the sound carrier and the chrominance subcarrier to the multiplier.

Accordingly, there occurs the problem that the video signal obtained by detecting with the multiplier to which the switching carrier is given contains a beat component having a frequency which corresponds to the difference between the sound carrier and the chrominance subcarrier and the image quality is thus deteriorated.

To avoid this type of problem, it is possible to reduce the components of the sound carrier and the chrominance subcarrier by increasing carrier purity of the VCO. However, such method narrows the operating range of the PLL circuit, and causes a disadvantage that it is difficult to compatibly set both the stable operation of the VCO and reduction of the components of sound carrier and the chrominance subcarrier.

Instead of the inter-carrier system, it is also possible to respectively use the SAW filters exclusively used for picture and sound, and to sufficiently reduce the sound carrier in the VIF signal with the picture SAW filter. With this method, it is possible to reduce the beat interference in a picture while maintaining S/N ratio of the audio output signal.

However, this method has a disadvantage that requirement of the exclusive SAW filters makes the structure complicated. Also, in this method, since wiring pattern for high frequency signals becomes complicated in mounting on a board, there arise problems that signals are easily coupled, and that a board is increased in its area when the circuit is implemented in an integrated circuit.

Incidentally, the sound carrier in the VIF signal between television broadcasting system M is 4.5 [MHz], and the sound carrier in the VIF signal between television broadcasting system B and system G are 5.5 [MHz], respectively. In addition, the chrominance subcarrier of the NTSC system is 3.58 [MHz] and the chrominance subcarrier of the PAL system is 4.43 [MHz], respectively.

OBJECT AND SUMMARY OF THE INVENTION

In view of the foregoing, an object of the present invention is to provide a signal detecting apparatus which can reduce the beat components resulting from the sound carrier and the chrominance subcarrier remaining in the video signal detected by using the PLL circuit with a simple arrangement.

The foregoing object and other objects of the invention have been achieved by the provision of a signal detecting apparatus having a PLL circuit to which an input signal including first and second signals is input, and a detecting circuit for detecting the first signal from the input signal based on an output of the PLL circuit, wherein: a filter for attenuating the second signal superposed on the input signal (e.g., a sound carrier component or a chrominance subcarrier component), for example, a sound carrier filter or a chrominance subcarrier filter, is provided in a PLL loop of the PLL circuit.

The first signal in the PLL loop is attenuated with the filter allocated in the PLL loop (e.g., the sound carrier filter or the chrominance subcarrier filter) to reduce the sound carrier component to be output from the PLL circuit, so that the beat component resulting from the second signal (the sound carrier and the chrominance subcarrier) which remain in the first signal detected by using the PLL circuit can be easily reduced with a simple arrangement.

The nature, principle and utility of the invention will become more apparent from the following detailed description when read in conjunction with the accompanying drawing in which like parts are designated by like reference numerals or characters.

DETAILED DESCRIPTION OF THE EMBODIMENT

Figure 1:
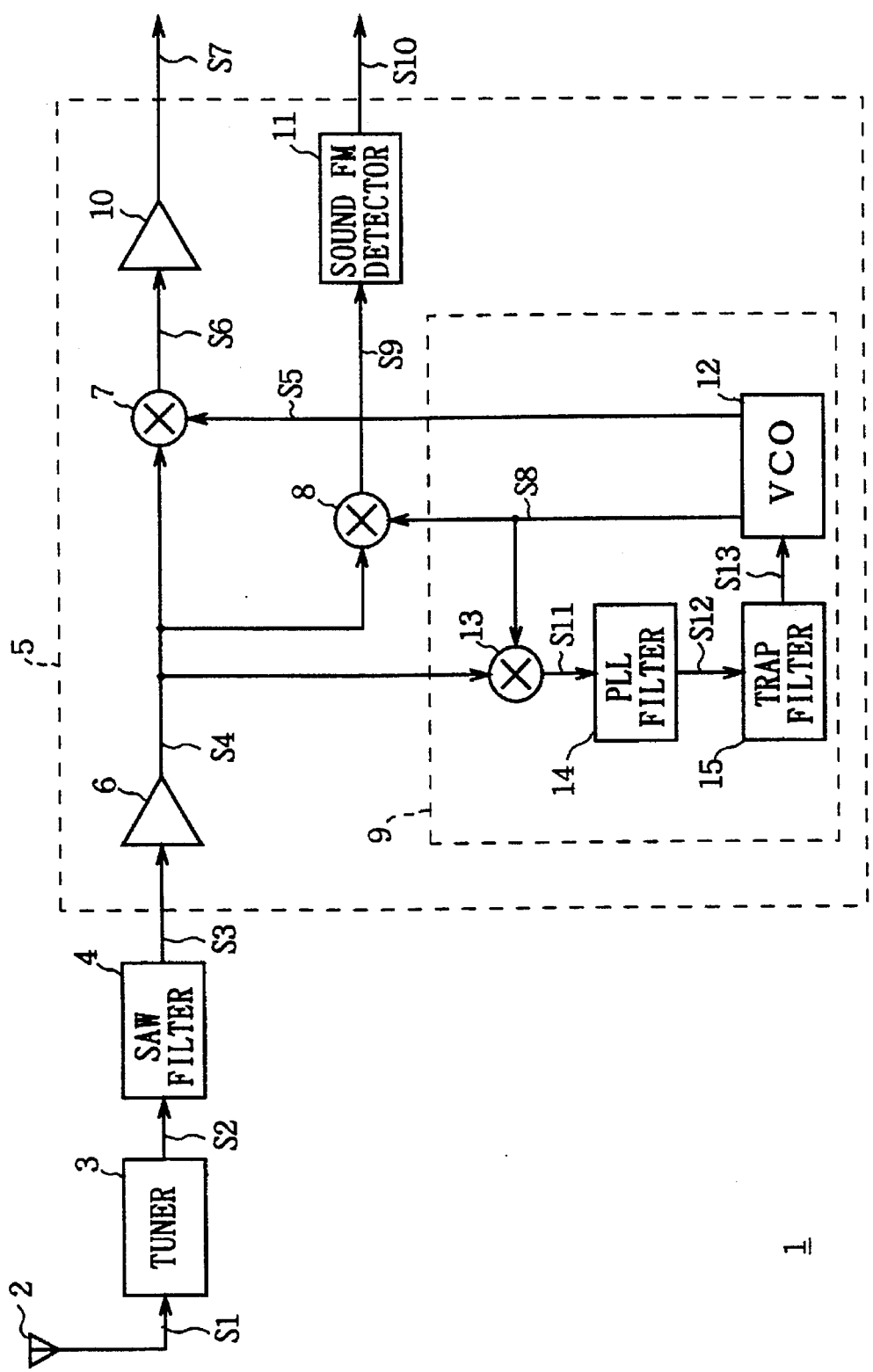
FIG. 1 is a connection diagram showing a video signal receiving apparatus according to an embodiment of the signal detecting apparatus of the present invention.

Preferred embodiments of the present invention will be described with reference to the accompanying drawing:

Referring to FIG. 1, 1 generally indicates a video signal receiving apparatus, in which a color television broadcasting signal S1 input from an antenna 2 is selected by a tuner 3 and then converted into a VIF signal S2. The VIF signal S2 passes through an SAW filter 4, and is input into a video detecting integrated circuit 5 as a VIF signal S3 in which a sound carrier and a chrominance subcarrier are attenuated to predetermined values.

The VIF signal S3 input in the video detecting integrated circuit 5 is amplified and converted into a VIF signal S4 by a video intermediate frequency amplifier 6, and is input in a video detector 7, a sound detector 8, and a PLL circuit 9.

The video detector 7 consists of a multiplier, to which an intermediate frequency carrier signal with phase 0°, i.e., a switching carrier S5 is input from the PLL circuit 9 to synchronously detect the VIF signal S4. This causes the video detector 7 to give a demodulated signal S6 to a video signal amplifier 10 so as to make a video signal S7 output.

On the other hand, the sound detector 8 consists of a multiplier, to which a switching carrier S8 with phase 90° is input from the PLL circuit 9 for beat down of the VIF signal S4. This causes the sound detector 8 to give a signal S9 to a sound FM detector 11 so as to make the sound signal S10 output.

The PLL circuit 9 inputs the VIF signal S4 and the switching carrier S8 output from a VCO 12 into a phase comparator 13 consisting of a multiplier for phase comparison. The phase comparator 13 gives a comparison output signal S11 to a PLL filter 14, and inputs a phase error signal S12 to a trap filter 15.

The trap filter 15 gives to the VCO 12 the sound carrier contained in the phase error signal S12 and a phase error signal S13 in which the chrominance subcarrier is attenuated, and controls the oscillation frequencies and the phases of the switching carriers S5 and S8 output from the VCO 12. The characteristics of the trap frequencies of the sound carrier and the chrominance subcarrier to be attenuated by the trap filter 15 are adjusted by an adjuster (not shown) above the video detecting integrated circuit 5.

Incidentally, the trap filter 15 come to have uneven characteristics due to production error, which is required to be adjusted. In this case, as an adjuster of the trap filter 15, a self-adjusting system is used which is disposed in the video detecting integrated circuit 5 for adjusting characteristics of other filters. Thus, there is no need to provide an adjusting system exclusively used for the trap filter 15.

In the above arrangement, the PLL circuit 9 applies a feedback loop on oscillation of the VCO 12 so as to synchronize with the phase of a video intermediate carrier component of the VIF signal S4. The VIF signal S4 contains the sound carrier and the chrominance subcarrier which are also contained in the comparison output signal S11. When the comparison output signal S11 passes through the trap filter 15, the phase error signal S13 is output in which the sound carrier and the chrominance subcarrier are sufficiently attenuated.

Then, the control of the VCO 12 by the phase error signal S13 causes the significant attenuation of the sound carrier and the chrominance subcarrier generated in the switching carriers S5 and S8 as compared with that in the prior art.

Accordingly, if a video is detected by multiplying the switching carrier S5 with the VIF signal S4, no beat component determined by the frequency of $f_A$-$f_{SC}$ (beats of 920 [KHz] in the system M and the NTSC system in Japan and the North America) would be generated even if the sound carrier and the chrominance subcarrier components exist in the VIF signal S4.

With the above arrangement, the sound carrier and the chrominance subcarrier in the PLL loop are attenuated by the trap filter 15 disposed in a stage before the VCO 12 in the PLL loop in order to reduce the sound carrier and the chrominance subcarrier components generated in the switching carrier S5 in the PLL circuit 9, so that the beat component of 920 [KHz] resulting from the sound carrier and the chrominance subcarrier both of which remain in the demodulated signal S6 detected by using the PLL circuit 9 can be easily reduced.

In addition, since the beat component of 920 [KHz] which is difficult to eliminate after detection can be reduced in the Video detecting integrated circuit 5, there is no need to add external parts to the video detecting integrated circuit 5.

Moreover, since the phase error signal S12 passes through the trap filter 15, the sound carrier and the chrominance subcarrier can be easily attenuated with simpler construction as compared with the case where the high frequency signal passes through, which requires a complicated wiring arrangement; thus the characteristics of the video signal S7 can be improved as described above.

In the embodiment described above, the trap filter 15 is disposed in a stage before the VCO 12. However, the present invention is not only limited to this. The filter position for attenuating the sound carrier and the chrominance subcarrier can be at any arbitrary location as long as it is in the PLL loop. Also in this case, the aforementioned effect can be attained.

Incidentally, the beat component of 920 [KHz] by the sound carrier and the chrominance subcarrier can also be reduced even by inserting a filter for attenuating the sound carrier and the chrominance subcarrier between the VCO 12 and the video detector 7. However, in this case, its characteristics should be established carefully enough because the switching carrier S5 is at a high frequency range.

Also, in the embodiment described above, the sound carrier and the chrominance subcarrier are simultaneously attenuated by the trap filter 15. However, the present invention is not only limited to this, but can be applied to a case where only the sound carrier is sufficiently attenuated by a filter.

Furthermore, both an active filter and a passive filter can be used as the trap filter 15 in the aforementioned embodiment. In this case, the filter and the other circuits may have either a bipolar transistor circuit construction or a field-effect transistor circuit construction or a field-effect transistor circuit construction.

As described above, according to the present invention, the first signal in the PLL loop is attenuated by the filter disposed in the PLL loop to reduce the first signal component output from the PLL circuit, so that the signal detecting apparatus can be realized which can easily reduce the beat component remained in the second signal detected by using the PLL circuit.

While the foregoing has described preferred embodiments of the invention, it will be obvious to those skilled in the art that various changes and modifications may be aimed, therefore, to cover in the appended claims all such changes and modifications that fall within the true spirit and scope of the invention.

What is claimed is:

1. A signal detecting apparatus comprising:
   a PLL circuit for receiving as input an input signal containing a first signal component and a second signal component;
   a filter in said PLL circuit for attenuating said second signal component;
   an oscillator in said PLL circuit for receiving a control signal from said filter and generating first and second switching carriers in response thereto; and
   a detecting circuit for detecting said first signal component based on a multiplication of said input signal with said first switching carrier.

2. A signal detecting apparatus comprising:
   a PLL circuit for receiving as input a VIF signal containing a chrominance subcarrier component and a sound carrier component;
   a trap filter in said PLL circuit for attenuating said sound carrier component;
   an oscillator in said PLL circuit for receiving a control signal from said filter and generating first and second switching carriers in response thereto; and
   a detecting circuit for detecting said chrominance subcarrier component based on a multiplication of said input signal with said first switching carrier.

3. An integrated circuit signal detecting apparatus comprising:
   an integrated circuit;
   a PLL circuit for receiving as input a VIF signal containing a chrominance subcarrier component and a sound carrier component;
   a bipolar active trap filter in said PLL circuit for attenuating said sound carrier component;
   an oscillator in said PLL circuit for receiving a control signal from said filter and generating first and second switching carriers in response thereto; and
   a detecting circuit for detecting said chrominance subcarrier component based on a multiplication of said input signal with said first switching carrier.

4. The signal detecting apparatus according to claim 1, wherein
   said filter attenuates said first signal component.

5. The signal detecting apparatus according to claim 4, wherein
   said filter for attenuating said first signal component is disposed in a stage before the oscillator of said PLL circuit.

6. The signal detecting apparatus according to claim 4, wherein
   said filter for attenuating said first and second signal components is disposed in a stage before the oscillator of said PLL circuit.

7. The signal detecting apparatus according to claim 4, wherein
   said input signal is a composite signal; and
   said first signal component is a chrominance subcarrier component.

8. The signal detecting apparatus according to claim 2, wherein
   said trap filter attenuates a chrominance subcarrier component contained in said VIF signal.

9. The signal detecting apparatus according to claim 3, wherein
   said trap filter attenuates a chrominance subcarrier component contained in said VIF signal.

10. A signal detecting apparatus, comprising:
    an input terminal for being supplied an input signal containing a video signal and an audio signal;
    an oscillator for being supplied a control signal and generating first and second output signals according to said control signal;
    a first calculating circuit for being supplied said input signal and the first output signal from said oscillator and outputting a calculated signal;
    a filter for attenuating high frequency of the output signal from said first calculating circuit;
    a trap filter in which a trap is disposed within frequency band range of said input signal for being supplied the output signal from said filter;
    a second calculating circuit for receiving and calculating said second output signal output from said oscillator and said input signal when an output signal from said trap filter is input to said oscillator as said control signal; and
    a third calculating circuit for inputting and calculating said input signal and the first output signal of said oscillator.

11. The signal detecting apparatus according to claim 10, wherein
    trap frequency of said trap filter is set to a chrominance subcarrier frequency of said video signal.

12. The signal detecting apparatus according to claim 10, wherein
    trap frequency of said trap filter is set to said sound carrier frequency.

13. The signal detecting apparatus according to claim 10, wherein
    trap frequency of said trap filter is set to said chrominance subcarrier frequency of said video signal and said sound carrier frequency.

14. The signal detecting apparatus according to claim 10, wherein
    the first and second output signals of said oscillator are made the difference each other in their phases.

15. The signal detecting apparatus according to claim 10, wherein
    said first calculating circuit is used as a phase detecting circuit.

16. The signal detecting apparatus according to claim 10, wherein:
    said second calculating circuit is used as a video signal synchronous detecting circuit; and
    said third calculating circuit is used as a sound detecting circuit.

17. A signal detecting apparatus, comprising:
    an input terminal for being supplied an input signal containing a video signal and an audio signal;
    an oscillator for being supplied a control signal and generating a first and second output signals according to said control signal;

a first calculating circuit for being supplied said input signal and the first output signal from said oscillator and outputting a calculated signal;

a filter for making an output signal obtained by attenuating high frequency of the output signal from said first calculating circuit;

a filter in which a trap is disposed within frequency band range of said input signal for being supplied said second output signal of said oscillator;

a second calculating circuit for receiving and calculating the output signal from said filter and said input signal; and a third calculating circuit for receiving and calculating said input signal and the first output signal of said oscillator.

18. The signal detecting apparatus according to claim 17 wherein trap frequency of said trap filter is set to a chrominance subcarrier frequency of said video signal.

19. The signal detecting apparatus according to claim 17, wherein trap frequency of said trap filter is set to said sound carrier frequency.

20. The signal detecting apparatus according to claim 17, wherein trap frequency of said trap filter is set to said chrominance subcarrier frequency of said video signal and said sound carrier frequency.

21. The signal detecting apparatus according to claim 17, wherein the first and second output signals of said oscillator are made the difference each other in their phases.

22. The signal detecting apparatus according to claim 17, wherein said first calculating circuit is used as a phase detecting circuit.

23. The signal detecting apparatus according to claim 17, wherein:

said second calculating circuit is used as a video signal synchronous detecting circuit; and said third calculating circuit is used as a sound detecting circuit.

24. A signal detecting apparatus constituted of a bipolar transistor integrated circuit, comprising:

an input terminal for being supplied an input signal containing a video signal and an audio signal;

an oscillator for being supplied a control signal and generating a first and second output signals according to said control signal;

a first calculating circuit for being supplied an input signal from said input terminal and the first output signal from said oscillator and outputting a calculated signal;

an active filter for attenuating high frequency of the output signal from said first calculating circuit;

a trap filter composed of an active filter, in which a trap is disposed within frequency band range of said input signal, for being supplied the output signal from said active filter;

a second calculating circuit for receiving and calculating said second output signal output from said oscillator and said input signal when an output signal from said trap filter is input to said oscillator as said control signal; and a third calculating circuit for receiving and calculating said input signal and the first output signal of said oscillator.

25. The signal detecting apparatus according to claim 24, wherein trap frequency of said trap filter is set to a chrominance subcarrier frequency of said video signal.

26. The signal detecting apparatus according to claim 24, wherein trap frequency of said trap filter is set to said sound carrier frequency.

27. The signal detecting apparatus according to claim 24, wherein trap frequency of said trap filter is set to said chrominance subcarrier frequency of said video signal and said sound carrier frequency.

28. The signal detecting apparatus according to claim 24, wherein the first and second output signals of said oscillator are made the difference each other in their phases.

29. The signal detecting apparatus according to claim 24, wherein said first calculating circuit is used as a phase detecting circuit.

30. The signal detecting apparatus according to claim 24, wherein:

said second calculating circuit is used as a video signal synchronous detecting circuit; and said third calculating circuit is used as a sound detecting circuit.

31. A signal detecting apparatus constituted of a bipolar transistor integrated circuit, comprising:

an input terminal for being supplied an input signal containing a video signal and an audio signal;

an oscillator for being supplied a control signal and generating a first and second output signals according to said control signal;

a first calculating circuit for being supplied an input signal from said input terminal and the first output signal from said oscillator and outputting a calculated signal;

an active filter for attenuating high frequency of the output signal from said first calculating circuit;

a trap filter having self-adjusting operation for adjusting filter characteristics of said active filter, in which a trap is disposed within frequency band range of said input signal, and to which the output signal from said active filter is supplied;

a second calculating circuit for receiving and calculating said second output signal output from said oscillator and said input signal when an output signal from said trap filter is input to said oscillator as said control signal; and a third calculating circuit for receiving and calculating said input signal and the first output signal of said oscillator.

32. The signal detecting apparatus according to claim 31, wherein trap frequency of said trap filter is set to a chrominance subcarrier frequency of said video signal.

33. The signal detecting apparatus according to claim 31, wherein trap frequency of said trap filter is set to said sound carrier frequency.

34. The signal detecting apparatus according to claim 31, wherein trap frequency of said trap filter is set to said chrominance subcarrier frequency of said video signal and said sound carrier frequency.

35. The signal detecting apparatus according to claim 31, wherein the first and second output signals of said oscillator are made the difference each other in their phases.

36. The signal detecting apparatus according to claim 31, wherein said first calculating circuit is used as a phase detecting circuit.

37. The signal detecting apparatus according to claim 31, wherein:

said second calculating circuit is used as a video signal synchronous detecting circuit; and said third calculating circuit is used as a sound detecting circuit.

38. A signal detecting apparatus as in claim 1, further comprising:

a second detecting circuit for detecting said second component based on a multiplication of said input signal with said second switching carrier.

39. A signal detecting apparatus as in claim 2, further comprising:

a second detecting circuit for detecting said second component based on a multiplication of said input signal with said second switching carrier.

40. A signal detecting apparatus as in claim 3, further comprising:

a second detecting circuit for detecting said second component based on a multiplication of said input signal with said second switching carrier.

* * * * *